(12) United States Patent
Yuda et al.

(10) Patent No.: US 7,067,436 B2
(45) Date of Patent: Jun. 27, 2006

(54) METHOD OF FORMING SILICON OXIDE FILM AND FORMING APPARATUS THEREOF

(75) Inventors: Katsuhisa Yuda, Tokyo (JP); Ge Xu, Tokyo (JP)

(73) Assignees: NEC Corp., Tokyo (JP); ANELVA Corp., Tokyo (JP)

(*) Notice: Subject to any disclaimer, the term of this patent is extended or adjusted under 35 U.S.C. 154(b) by 0 days.

(21) Appl. No.: 10/832,502

(22) Filed: Apr. 27, 2004

(65) Prior Publication Data

US 2004/0198071 A1 Oct. 7, 2004

Related U.S. Application Data

(62) Division of application No. 09/818,972, filed on Mar. 27, 2001.

(30) Foreign Application Priority Data

Jul. 12, 2000 (JP) .......................... 2000-211005

(51) Int. Cl.
*H01L 21/31* (2006.01)
*H01L 21/469* (2006.01)

(52) U.S. Cl. ...................................... 438/758; 438/788

(58) Field of Classification Search ............... 438/758, 438/778, 788, 789; 427/571; 118/723
See application file for complete search history.

(56) References Cited

U.S. PATENT DOCUMENTS

| | | | | |
|---|---|---|---|---|
| 4,683,838 A | * | 8/1987 | Kimura et al. | 118/715 |
| 5,364,665 A | * | 11/1994 | Felts et al. | 427/571 |
| 5,578,130 A | * | 11/1996 | Hayashi et al. | 118/723 E |
| 5,953,118 A | * | 9/1999 | O'Rourke et al. | 356/326 |
| 5,962,083 A | * | 10/1999 | Hatanaka et al. | 427/571 |
| 5,976,992 A | * | 11/1999 | Ui et al. | 438/788 |
| 6,044,792 A | * | 4/2000 | Ogawa et al. | 118/723 E |
| 6,287,988 B1 | * | 9/2001 | Nagamine et al. | 438/770 |
| 6,838,394 B1 | * | 1/2005 | Ohmi et al. | 438/770 |

* cited by examiner

*Primary Examiner*—Walter L. Lindsay, Jr.
(74) *Attorney, Agent, or Firm*—Muirhead and Saturnelli, LLC

(57) ABSTRACT

In a method of forming a silicon oxide film, the silicon oxide film is formed on a substrate by the use of a plasma CVD method. A plasma-generating region is separated from a deposition region which includes excitation oxygen molecules and excitation oxygen atoms. Plasma of first gas containing oxygen atoms is formed in the plasma-generating region while second gas containing silicon atoms is supplied into the deposition region. First quantity of the excitation oxygen molecules and second quantity of the excitation oxygen atoms are controlled intentionally.

5 Claims, 3 Drawing Sheets

METHOD OF FORMING SILICON OXIDE FILM AND FORMING APPARATUS THEREOF

This application is a divisional of U.S. application Ser. No. 09/818,972 filed Mar. 27, 2001 (pending).

BACKGROUND OF THE INVENTION

This invention broadly relates to a method of forming a silicon oxide film by the use of plasma CVD (Chemical Vapor Deposition) apparatus, and a forming apparatus thereof.

More specifically, this invention relates to a method of forming a silicon oxide film by the CVD method using plasma CVD apparatus in which a plasma formation region and a substrate process (deposition) region are separated to each other.

Recently, suggestion has been made about a remote plasma CVD apparatus as a plasma CVD apparatus for depositing a film on a substrate on the condition that a plasma damage is suppressed.

In such a remote plasma CVD apparatus, a plasma formation region and a substrate process (deposition) region generally are separated to each other.

This CVD apparatus is becoming increasingly important in a process for manufacturing a semiconductor device to achieve both high reliability and high performance.

For example, disclosure has been made about a parallel plate remote plasma CVD apparatus as the remote plasma CVD apparatus for a large-scale substrate in Japanese Unexamined Patent Publication (JP-A) No. Sho. 53-91665 (hereinafter, will be referred to as a conventional example).

The large-scale substrate is generally used in a process for forming a switching transistor of a flat panel display having a large area, a process for forming a driving circuit transistor, and a silicon wafer process for a wafer having a large diameter.

Such a parallel plate remote plasma CVD apparatus is illustrated in FIG. 1, and is provided with a plasma sealing electrode 80 having a plurality of penetrations (namely, radical passing holes 50) between a substrate susceptor 20 and a high-frequency applying electrode 10 in the conventional parallel plate plasma CVD apparatus. Herein, a substrate 30 is arranged on the susceptor 20 while the plasma sealing electrode 80 has a hollow structure.

With this structure, plasma 60 of a first gas 100 is sealed between the plasma-sealing electrode 80 and the high-frequency applying electrode 10.

Under such a circumstance, the plasma is uniformly generated by the use of the parallel plates with a large area. Consequently, the radicals necessary to the deposition process are uniformly supplied in the large area.

In such a conventional example, a second gas, which is not decomposed with plasma, is supplied via neutral gas injection holes 90 (or spraying holes) on the condition that the second gas is uniformly distributed along an electrode surface. In consequence, the deposition process due to reaction with diffused radicals can be uniformly carried out along the large area.

Subsequently, description will be made about a method for depositing the silicon oxide film on the substrate by the use of the conventional parallel plate remote plasma CVD apparatus illustrated in FIG. 1.

First, oxygen gas is supplied to the plasma generation region as the first gas 100, and the high-frequency power is applied to the high-frequency applying electrode 10 to generate oxygen plasma 60.

This oxygen plasma 60 is sealed between the plasma sealing electrode 80 and the high-frequency applying electrode 10. Thereby, only excitation oxygen atoms, excitation oxygen molecules, oxygen atoms, oxygen molecules and ozone are supplied to the deposition region via the radical passing holes 50. In this case, oxygen ions and electrons almost are not supplied thereto.

In the meantime, monosilane gas as the second gas 110 is supplied into the plasma-sealing electrode 80 having the hollow structure.

The monosilane gas is supplied from the neutral gas injection holes 90 which are opened on the substrate side surface of the plasma-sealing electrode 80.

With this structure, the monosilane gas reacts with the excitation oxygen atoms, the excitation oxygen molecules, the oxygen atoms, the oxygen molecules and the ozone in vapor phase between the plasma-sealing electrode 80 and the substrate 30.

As a result of the reaction, silicon oxide precursors, such as SiHx, SiHxOy, and SiOy are produced. The precursors are attached on the substrate 30, and oxidation reaction or thermal dissociation is carried out on a growth surface on the substrate 30 to deposit the silicon oxide film on the substrate 30.

The radical passing holes 50 and the neutral gas injection holes 90 are uniformly distributed along the plane on the plasma-sealing electrode 80. Consequently, flax plane distribution of gas supplied from the respective holes will readily become uniform.

Accordingly, vapor phase reaction uniformly occurs in the plane on the substrate, and the silicon oxide precursors are uniformly distributed in the plane on the substrate 30. As a result, film distribution of the silicon oxide film formed on the substrate 30 also becomes uniform in the plane.

Thus, great attention has been given to the parallel plate remote plasma CVD as a method for depositing the silicon oxide film or a silicon nitride film serving as a gate insulating film of a thin-film transistor (TFT) formed on a large glass substrate, an amorphous silicon film serving as an active layer or a gate electrode of the thin-film transistor formed on the large-area glass substrate, and the silicon oxide film or the silicon nitride film serving as an interlayer insulating film of a transistor device formed on a large-area silicon substrate.

This is because a thin-film having excellent uniformity in a substrate plane can be deposited on the condition that the plasma damage is suppressed in the parallel plate remote plasma CVD.

Further, the remote plasma CVD apparatus has another advantages. Specifically, existing density of ion or electrons can be ignored in the deposition region. In consequence, reaction in the vapor phase relatively becomes simple.

Moreover, quantity of reaction species, such as, oxygen atom excitation species and oxygen molecular excitation species or quantity of an intermediate generating species formed in the vapor phase, such as SiHx, SiHxOy, and SiOy can be controlled.

However, a specific species is particularly not identified and measured so as to control the quantity thereof in the conventional example.

In the conventional example, the control of the species quantity is estimated based on experience. As a result of the estimation, adjustment must be about CVD deposition conditions, such as, pressure, plasma excitation power, gas flow rate, and gas composition.

Thus, the advantage of the remote plasma CVD apparatus, which can control the quantity of the reaction species and the intermediate generating species, is not utilized at maximum in the conventional example. As a result, the silicon oxide film can not be formed with high quality in the conventional example.

SUMMARY OF THE INVENTION

It is therefore of this invention to provide a method for forming a silicon oxide film having high quality by intentionally controlling quantity of specific species, such as, excitation oxygen molecules and excitation oxygen atoms in a remote plasma CVD using vapor chemical reaction.

In a method of forming a silicon oxide film according to this invention, the silicon oxide film is formed on a substrate by the use of vapor phase chemical reaction using a plasma CVD method.

Specifically, a plasma-generating region is separated from a deposition region which includes excitation oxygen molecules and excitation oxygen atoms.

In this event, plasma of first gas containing oxygen atoms is formed in the plasma-generating region while second gas containing silicon atoms is supplied into the deposition region.

Under such as circumstance, first quantity of the excitation oxygen molecules and second quantity of the excitation oxygen atoms are controlled intentionally.

In this case, the intentional control is preferably carried out such that the second quantity is relatively reduced for the first quantity.

For example, the intentional control is carried out by changing a deposition condition of the silicon oxide film.

Herein, the deposition condition may comprise pressure in the deposition region.

Further, the deposition region is specified by an optical emission spectrum. In this event, the excitation oxygen molecule has a first luminescent peak near 761 nm while the excitation oxygen atom has a second luminescent peak near 777 nm.

Moreover, a relationship between a first area A(O2) of the first luminescent peak and a second area A(O) of the second luminescent peak near satisfies a relation of 10*A(O2)>A(O).

In an apparatus for forming the silicon oxide film according to this invention, the silicon oxide film is formed on the substrate by the use of a plasma CVD method.

Under such a circumstance, a plasma-generating region forms plasma of first gas containing oxygen atoms.

A deposition region is placed on the substrate so as to be separated from the plasma-generating region, and includes excitation oxygen molecules and excitation oxygen atoms.

Further, a substrate holding mechanism is provided with the substrate in the deposition region.

Moreover, a supply unit supplies second gas containing silicon atoms into the deposition region.

In addition, a control unit intentionally controls first quantity of the excitation oxygen molecules and second quantity of the excitation oxygen atoms.

With this structure, the control unit comprises an optical emission spectrometer which spectrally detects luminescence of the deposition region.

In this case, a light transmitting window is arranged at the chamber wall which is preferably placed in the deposition region. Further, the optical emission spectrometer spectrally measures a light beam passing through the light transmitting window.

The deposition region has a luminescent spectrum which is spectrally measured by the optical emission spectrometer. In this event, the excitation oxygen molecule has a first luminescent peak near 761 nm while the excitation oxygen atom has a second luminescent peak near 777 nm.

A deposition condition is controlled such that a relationship between a first area A(O2) of the first luminescent peak and a second area A(O) of the second luminescent peak near satisfies a relation of 10×A(O2)>A(O).

For example, the deposition condition is controlled by changing pressure of the deposition region.

As mentioned above, the plasma CVD apparatus includes a plasma generation region for forming plasma of gas containing oxygen atoms, a substrate holding mechanism for arranging the substrate outside the plasma generation region, and means for supplying gas containing silicon atoms between the plasma generation region and the substrate. The silicon oxide film is deposited by the use of such a plasma CVD apparatus in this invention.

In this event, the excitation oxygen molecules and the excitation oxygen atoms exist between the plasma generation region and the substrate. The quantity of and the excitation oxygen atoms is reduced by producing such a state that the excitation oxygen molecules exist. Thereby, the excessive vapor phase reaction is suppressed, and the intermediate generation species, such as, OH and HSiO, can be reduced.

The OH or HSiO forms defects, such as, Si—OH or Si—H in the silicon oxide film to deteriorate the electric characteristic of the silicon oxide film. Consequently, if the intermediate generation species can be reduced, the electric characteristic of the silicon oxide film can be improved largely.

In this invention, optical emission spectrum between the plasma generation region and the substrate has luminescent peak near 761 nm and the luminescent peak near 777 nm.

In this event, the luminescent peak near 761 nm corresponds to the excitation oxygen molecules, and indicates that the excitation oxygen molecules exist between the plasma generation region and the substrate.

As described above, if the excitation oxygen molecules exist, the quantity of the oxygen atoms or the excitation oxygen atoms will be reduced. Thereby, the excessive vapor phase reaction will be suppressed, and the intermediate generation species, such as, OH or HSiO, can be reduced also.

Further, the quantity of the excitation oxygen atoms is preferably reduced such that the relationship between the area A(O2) of the luminescent peak near 761 nm and the area A(O) of the luminescent peak near 777 nm satisfies the relation of 10*A(O2)>A(O). Thereby, the intermediate generating species, such as, OH and HSiO, can be reduced sufficiently.

Moreover, the plasma CVD apparatus includes a plasma generation region for forming plasma of gas containing oxygen atoms, the substrate holding mechanism for arranging the substrate outside the plasma generation region, and means for supplying gas containing silicon atoms between the plasma generation region and the substrate.

The CVD apparatus further includes an optical emission spectrometer for spectrally detecting the luminescence in the region between the plasma generation region and the substrate.

With such a structure, the optical emission spectrometer is connected to the system for controlling the CVD apparatus.

Under this circumstance, the CVD apparatus controlling system controls the CVD deposition condition such that the relationship between the area A(O2) of the luminescent peak near 761 nm and the area A(O) of the luminescent peak near 777 nm satisfies the relation of 10*A(O2)>A(O).

As mentioned above, the quantity of the excitation oxygen atoms is reduced so as to satisfy the relation of 10*A(O2)>A(O). Thereby, the intermediate generating species, such as, OH and HSiO, can be reduced sufficiently.

Further, the optical emission spectrometer interlocks with the CVD device control system. Thereby, the spectral measuring result is reflected for the CVD condition with real time, so that the CVD deposition can carried out so as to satisfy the relation of 10*A(O2)>A(O).

Thus, it is possible to control the quantity of the excitation oxygen molecules and the quantity of the excitation oxygen atoms in the remote plasma CVD in which the silicon oxide film is deposited by the use of the vapor phase chemical reaction in this invention.

In consequence, the silicon oxide film can be formed with high quality such that the excessive vapor phase reaction is suppressed.

DESCRIPTION OF PREFERRED EMBODIMENT

Referring to FIGS. 2 through 6, description will be made about an embodiment of this invention. Herein, it is to be noted that a silicon oxide film is deposited by the use of a remote plasma CVD using oxygen and monosilane.

Figure 1:
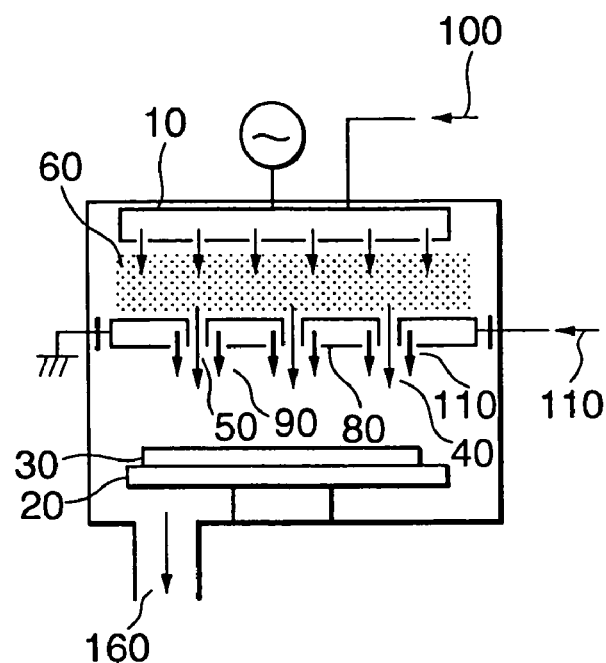
FIG. 1 is a side schematic view showing a parallel plate remote plasma CVD apparatus in the conventional example.
Figure 2:
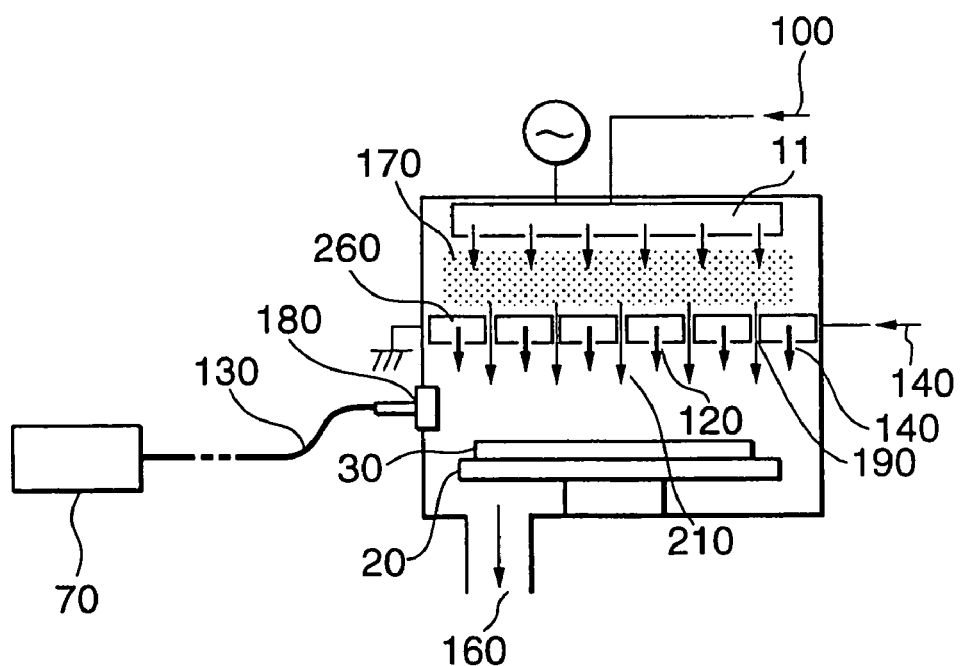
FIG. 2 is a side schematic view showing a remote plasma CVD apparatus according to an embodiment of this invention.

A remote plasma CVD apparatus basically includes a vacuum chamber, which is capable of exhausting in vacuum, a high-frequency applying electrode 11, an oxygen plasma generating region 170, a substrate susceptor 20, which is provided with a substrate 30, an oxygen radical passing holes (namely, penetrations) 190, and a plasma sealing plate/monosilane injector 260, which has monosilane injecting holes 120 and is electrically ground, as illustrated in FIG. 2. Herein, it is to be noted that the plasma sealing plate/monosilane injector 260 has a plurality of holes.

With such a structure, an oxygen plasma generating region 170 and a deposition region, in which the substrate 30 is positioned, are separated via the ground plasma sealing plate/the monosilane injector 260.

Further, a hole diameter of the oxygen radical passing hole 190 is substantially equal to or smaller than Debye length of the plasma. Consequently, ions and electrons generated in the plasma-generating region can not almost invade or enter into the deposition region. As a result, the density of the ions or electrons can be ignored near the substrate 30.

Figure 3:
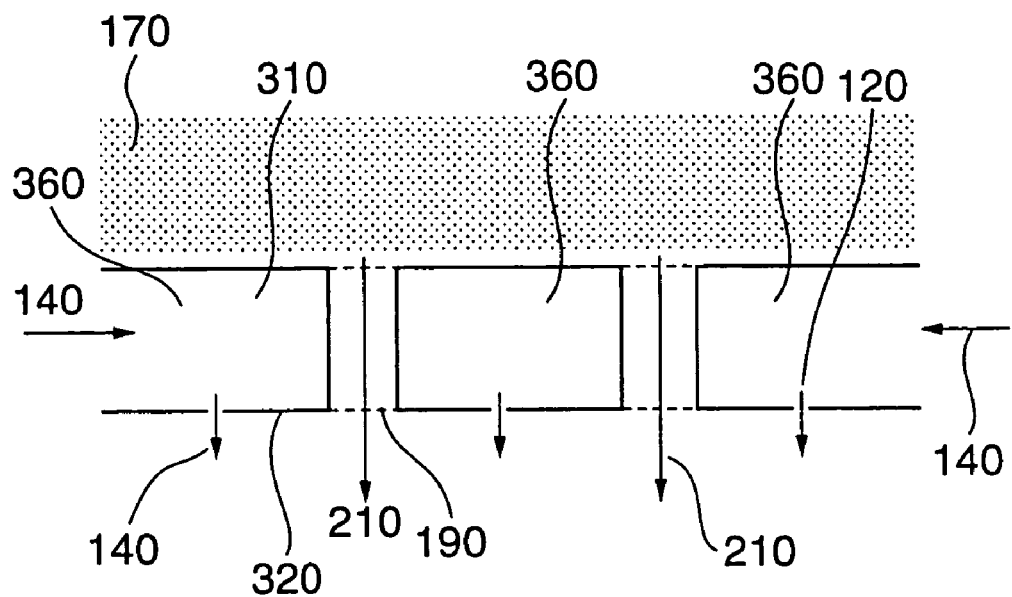
FIG. 3 is a cross sectional schematic view showing a plasma sealing plate/monosilane injector according to an embodiment of this invention.

As illustrated in FIGS. 3 and 4, the plasma sealing plate/monosilane injector 260 has a hollow portion 360 interposed between a plasma sealing upper plate 310 and a plasma sealing lower plate 320.

In such a plasma sealing plate/monosilane injector 260, a great number of oxygen radical passing holes 190 and monosilane injecting holes 120 are opened in plane. In this event, oxygen atoms, excitation oxygen atoms, excitation oxygen molecules, oxygen molecules and ozone generated in the oxygen plasma generating region 170 are introduced to a substrate side through the oxygen radical passing holes 190 while the monosilane is injected to the substrate side through the monosilane injecting holes 120.

Figure 4A:
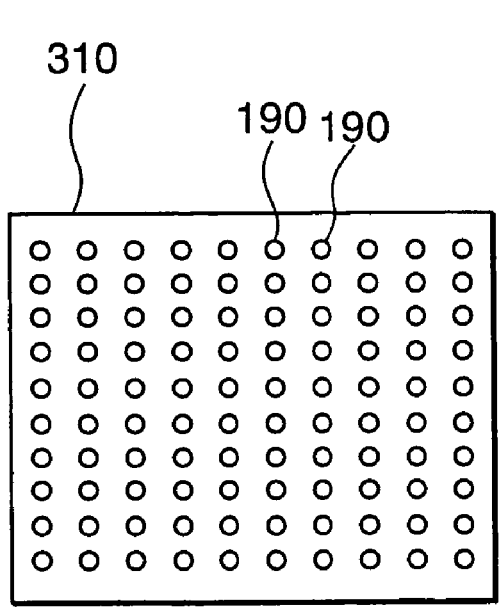
FIGS. 4A and 4B are plan schematic views showing a plasma sealing plate/monosilane injector according to an embodiment of this invention.
Figure 4B:
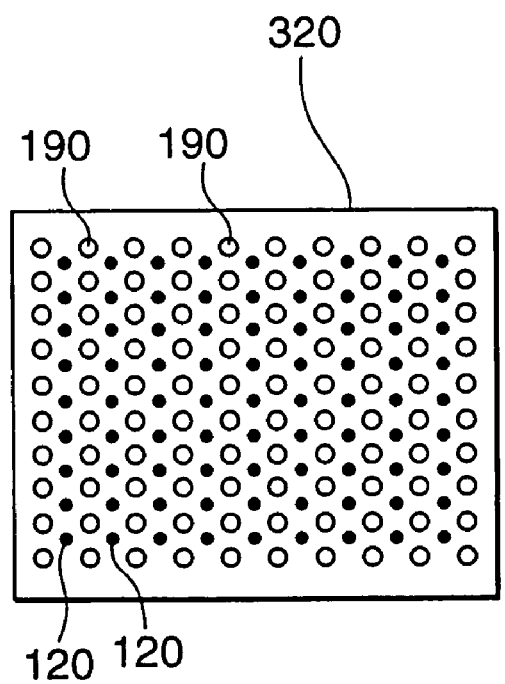

Although the holes are uniformly opened in plane as illustrated in FIGS. 4A and 4B, an opening manner is not restricted to this manner. For example, the distribution of the holes may be higher in an opening rate of a center portion. Alternatively, it may be higher in the opening rate of a periphery portion.

As illustrated in FIG. 3, the oxygen radical passing holes 190 are placed independently of the monosilane injecting holes 120. With this structure, oxygen gas 210 containing excitation species and radicals is not mixed with the monosilane gas 140 in the hollow portion 360 of the plasma sealing plate/monosilane injector 260.

Although the monosilane becomes uniform in plane inside the hollow portion 360, a diffusion plate (not shown) may be arranged in the hollow portion 360 of the plasma sealing plate/monosilane injector 260 in order to supply the monosilane more uniformly.

A system for performing an optical emission measurement includes a light transmitting window 180 placed at a chamber wall in the deposition region between the plasma sealing plate/monosilane injector 260 and the substrate 30, a spectral system 70 for spectrally measuring a transmitted light beam, and an optical fiber 130 for transmitting the light beam from the light transmitting window 180 into the spectral system 70.

The luminescence in the deposition region is weaker than that in the plasma-generating region. Therefore, an optical detector (not shown) of the spectral system 70 is preferably a detector having high sensitivity, such as a thermoelectric cooling CCD (Charge Coupled Device). Further, it is preferable that the optical detector can simultaneously measure each wavelength in multi-channel because exposure time must be long.

Subsequently, description will be hereinafter made about a method for depositing the silicon oxide film.

The oxygen gas 150 is introduced into the CVD chamber exhausted in vacuum at flow rate of 1 SLM, and exhausting ability is controlled such that the pressure near the substrate 30 becomes 27 Pa. Use is made about the plasma sealing plate/monosilane injector 260 having the oxygen radical passing holes 190. Herein, it is to be noted that the hole is fine in a hole diameter.

As a result, the pressure at the side of the plasma generating region becomes 58 Pa by defining the plasma sealing plate/monosilane injector 260 as a boundary, and is about twice in comparison with the deposition region in which the substrate 30 is positioned.

Next, the high-frequency power is applied to the high-frequency applying electrode 11 with the excitation frequency of 60 MHz to form the oxygen plasma. The oxygen plasma-generating region 170 is depart from the substrate 30.

Further, the plasma sealing plate/monosilane injector 260 is placed between the substrate 30 and the oxygen plasma-generating region 170. Herein, the plasma sealing plate/monosilane injector 260 has the oxygen radical passing holes 190 (penetrations) including small opening diameters.

Under this circumstance, the plasma density falls within the range between $10^8$ cm$^{-3}$ and $10^{10}$ cm$^{-3}$, both inclusive in the oxygen plasma generating region 170 while the plasma density is $10^4$ cm$^{-3}$ or less in the region between the plasma sealing plate/monosilane injector 260 and the substrate 30.

More specifically, electrons, oxygen atom ions, oxygen molecular ions, oxygen atoms, excitation oxygen atoms, oxygen molecules and ozone exist in the oxygen plasma-generating region 170. By contrast, the electrons and ions are not almost reach the deposition region between the plasma sealing plate/monosilane injector 260 and the substrate 30. Namely, the electrons and ions can be ignored in the deposition region.

In this case, the oxygen atoms, the excitation oxygen atoms, the excitation oxygen molecules, the oxygen molecules and the oxygen serve to react with monosilane gas 140 introduced into the deposition region in order to form the silicon oxide film.

The oxygen gas 210 containing these excitation species and radicals diffuses to the deposition region through the oxygen radical passing holes 190, and reacts with the monosilane 140 which is injected from the monosilane injecting holes 120 at the flow rate of 10 SCCM, to form the silicon oxide precursor, such as, SiOx, SiOxHy, and SiHy. Thereby, the silicon oxide film is finally deposited on the substrate 30.

As mentioned above, the plasma density between the plasma sealing plate/monosilane injector 260 and the substrate 30 becomes excessively low. Consequently, the plasma damage against the substrate 30 is extremely low compared with the normal parallel plate plasma CVD.

This advantage remarkably appears when the substrate surface corresponds to the silicon surface on which the MOS interface is formed. In the case where the silicon oxide film is deposited on a single crystal silicon substrate by the use of the normal parallel plate plasma CVD, MOS interface state density falls within the range between $10^{11}$ eV$^{-1}$ and $10^{12}$ cm$^{-2}$ eV$^{-1}$, both inclusive.

In contrast, when the silicon oxide film is deposited by the use of the remote plasma CVD, the interface state density becomes low at level of $10^{10}$ cm$^{-2}$ eV$^{-1}$.

Figure 5:
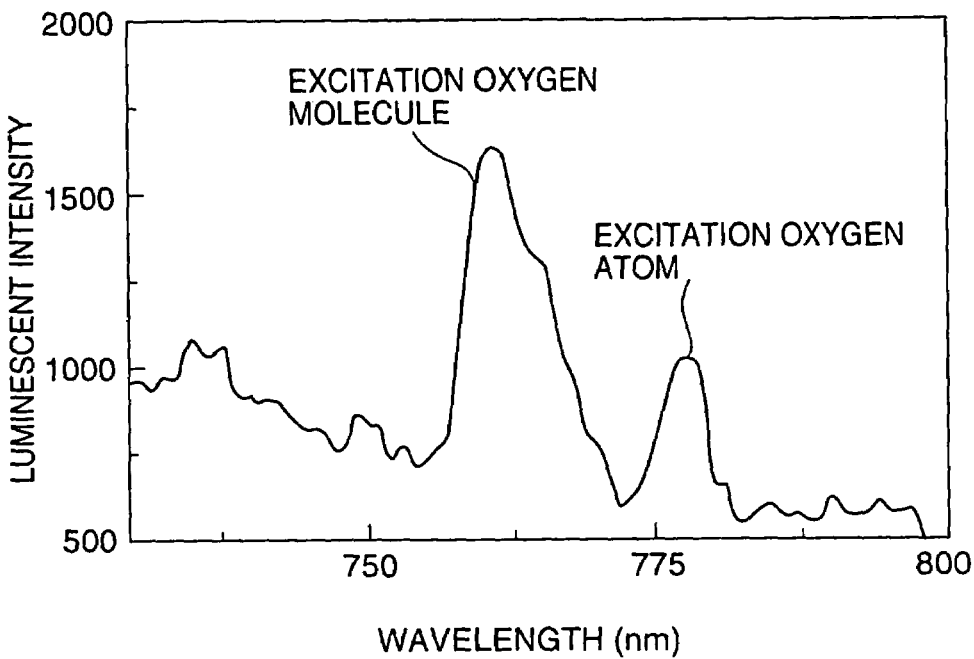
FIG. 5 is a diagram showing an example of optical emission spectrum in a deposition region according to an embodiment of this invention.

In this case, the optical emission spectrum was measured in the deposition region between the plasma sealing plate/monosilane injector 260 and the substrate 30, as illustrated in FIG. 5.

The luminescent peak near 761 nm depends upon the excitation oxygen molecule while the luminescent peak near 777 nm depends upon the excitation oxygen atoms.

The excitation oxygen molecules were not observed at 13.56 MHz which used as the excitation frequency in the many cases. By contrast, the excitation oxygen molecules were observed at the excitation of 60 MHz used in the embodiment in the cause of the high-frequency excitation.

Meanwhile, when microwave excitation plasma including the ECR (Electron Cycrotron Resonance) plasma is used, it is known that the excitation oxygen molecules are observed. The ultra high-frequency excitation or the microwave excitation, such as, 60 MHz and 27 MHz is effective so that the oxygen excitation molecules exist in the deposition region.

Thus, the excitation oxygen atoms serve to form the excitation oxygen molecules, and they finally become the oxygen atoms in many cases, and as a result, the existing density of the excitation oxygen atoms becomes low.

The reaction rate between the excitation oxygen molecule and SiHx is lower with one order or higher than the reaction rate between the excitation oxygen atom and SiHx. In consequence, the vapor phase reaction is suppressed in the deposition region in which the excitation oxygen molecules exist In particular, the intermediate generating species, such as, OH and HSiO, can be reduced largely.

The OH or HSiO forms the defect, such as, Si—OH or Si—H in the silicon oxide film to degrade the electric characteristic of the silicon oxide film. Consequently, if the intermediate generating species can be reduced, the electric characteristic of the silicon oxide film is enhanced.

Further, the quantity of the excitation oxygen atoms is reduced such that the relationship between the area A(O2) of the luminescent peak near 761 nm and the area A(O) of the luminescent peak near 777 nm satisfies the relation of 10*A(O2)>A(O). Thereby, the intermediate generating species, such as, OH and HSiO, can be reduced sufficiently.

Figure 6:
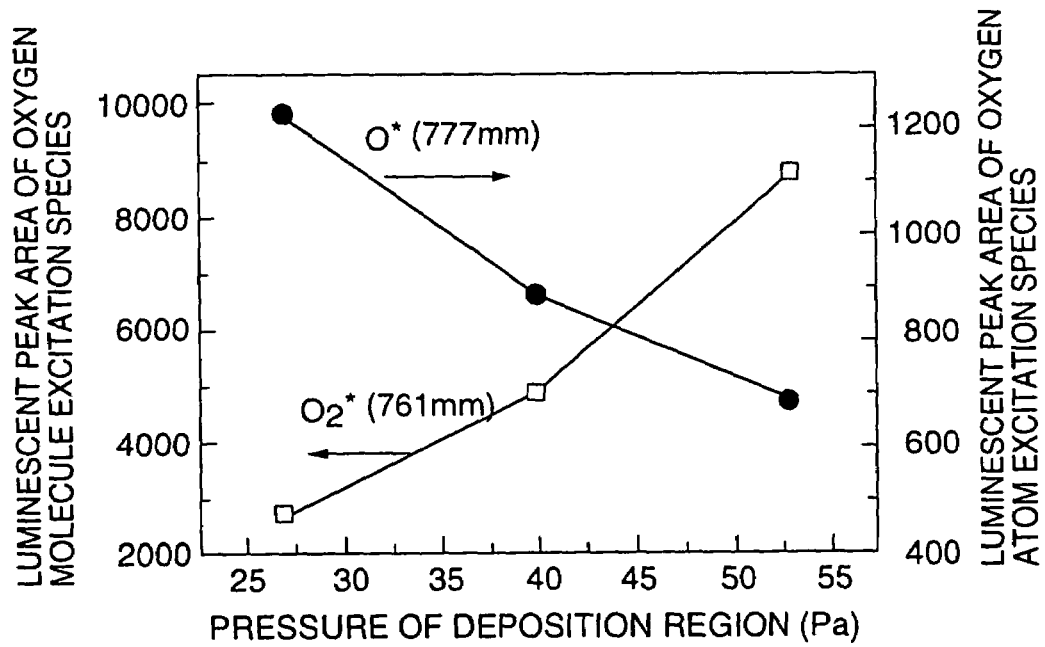
FIG. 6 is a diagram showing pressure dependency upon peak area intensity of luminescent spectrum in a deposition region according to an embodiment of this invention.

In FIG. 6, the luminescent peak area A(O2) of the oxygen molecule excitation species and the luminescent peak area A(O) of the oxygen atom excitation species are plotted for the pressure of the deposition region.

As illustrated in FIG. 6, the relation of 10*A(O2)>A(O) is about twice in the case of 27 Pa. This condition sufficiently satisfies the relation of 10*A(O2)>A(O).

In this event, this ratio can be increased in dependence upon the deposition condition. For example, the quantity of the excitation oxygen molecules can be increased by raising up the pressure of the deposition region while the quantity of the excitation oxygen atoms can be reduced, as illustrated in FIG. 6.

In the example illustrated in FIG. 6, when the deposition region pressure is equal to 40 Pa, the ratio of 10*A(O2)>A(O) is about 55. On the other hand, when the deposition region pressure is equal to 53 Pa, the ratio of 10*A(O2)>A(O) is about 127.

Thus, the quantity of the excitation oxygen atoms and the excitation oxygen molecules is sensitive for the pressure of the deposition region. In consequence, the optical emission spectrometer for spectrally detecting the luminescence of the region between the plasma sealing plate/monosilane injector 260 and the substrate 30 is connected to the system for controlling the CVD apparatus.

With this structure, when the CVD apparatus control system controls the deposition region pressure so as to satisfy the ratio of 10*A (O2)>A(O), the vapor phase can be accurately controlled.

If the relationship shown in FIG. 6 is determined in advance, it is possible to gradually change the ratio between the quantity of the excitation oxygen molecules and the quantity of the excitation oxygen atoms during the deposition process.

Further, the high-frequency power, the gas flow rate, and the gas composition give affects for the quantity the excitation oxygen molecules and the quantity of the excitation oxygen atoms other than the deposition region pressure. In consequence, all CVD deposition conditions may be controlled so as to satisfy the ratio of 10*A(O2)>A(O).

Although the plasma sealing plate/monosilane injector 260 is used in the above-mentioned embodiment, a plasma sealing electrode, which does not have silane injecting function, may be used instead.

Further, although the plane type of plate/monosilane injector is used in the above-mentioned embodiment, any types of injectors, such as, a ring-like monosilane injector, a frame-like injector, a lattice type injector, and a linear type injector, may be used.

Moreover, the silicon oxide film is deposited by the use of the monosilane and the oxygen in the above-mentioned embodiment, higher silane such as disilane, or liquid Si material such as TEOS (Tetraethoxysilane) may be used instead of the monosilane. In addition, nitrous oxide or nitric oxide may be used in lieu of the oxygen.

Although the parallel plate remote plasma CVD apparatus is used in the above-mentioned embodiment, any type of apparatuses, such as, a CVD apparatus using microwave plasma, electron cycrotron resonance plasma, inductive coupled plasma and helicon wave plasma, may be applicable.

While this invention has thus far been disclosed in conjunction with several embodiments thereof, it will be readily possible for those skilled in the art to put this invention into practice in various other manners.

What is claimed is:

1. A method of forming a silicon oxide film on a substrate by the use of vapor phase chemical reaction using a plasma CVD method, comprising the steps of:

separating a plasma generating region from a deposition region which includes excitation oxygen molecules and excitation oxygen atoms, plasma of a first gas containing oxygen atoms being formed in the plasma generating region while a second gas containing silicon atoms being supplied into the deposition region; and intentionally controlling a first quantity of the excitation oxygen molecules and a second quantity of the excitation oxygen atoms by controlling at least a deposition pressure of the silicon oxide film, wherein said deposition pressure is controlled such that said second quantity is relatively less than said first quantity.

2. A method as claimed in claim 1, wherein:

the intentional control is carried out by changing at least one additional deposition condition other than deposition pressure of the silicon oxide film.

3. A method as claimed in claim 1, wherein:

the deposition region is specified by an optical emission spectrum, the excitation oxygen molecule has a first luminescent peak near 761 nm, and the excitation oxygen atom has a second luminescent peak near 777 nm.

4. A method as claimed in claim 3, wherein:

a relationship between a first area A(O2) of the first luminescent peak and a second area A(O) of the second luminescent peak near satisfies a relation of $10 \times A(O2) > A(O)$.

5. A method of forming a silicon oxide film on a substrate by the use of vapor phase chemical reaction using a plasma CVD method, comprising the steps of:

separating a plasma generating region from a deposition region which includes excitation oxygen molecules and excitation oxygen atoms, plasma of a first gas containing oxygen atoms being formed in the plasma generating region while a second gas containing silicon atoms being supplied into the deposition region; and intentionally controlling a first emission intensity of the excitation oxygen molecules and a second emission intensity of the excitation oxygen atoms, wherein said second emission intensity is controlled to be relatively less than said first emission intensity.

* * * * *